(12) United States Patent
Kim et al.

(10) Patent No.: US 9,373,625 B2
(45) Date of Patent: Jun. 21, 2016

(54) MEMORY STRUCTURE DEVICE HAVING A BURIED GATE STRUCTURE

(71) Applicant: SK hynix Inc., Gyeonggi-do (KR)

(72) Inventors: Seung Hwan Kim, Seoul (KR); Jeong Hoon Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/506,418

(22) Filed: Oct. 3, 2014

(65) Prior Publication Data

US 2015/0333069 A1 Nov. 19, 2015

(30) Foreign Application Priority Data

May 14, 2014 (KR) ........................ 10-2014-0057977

(51) Int. Cl.
*H01L 23/532* (2006.01)
*H01L 21/768* (2006.01)
*H01L 27/108* (2006.01)
*H01L 29/423* (2006.01)
*H01L 29/06* (2006.01)
*H01L 29/40* (2006.01)
*H01L 23/522* (2006.01)

(52) U.S. Cl.
CPC .... *H01L 27/10823* (2013.01); *H01L 21/76897* (2013.01); *H01L 27/10876* (2013.01); *H01L 29/0649* (2013.01); *H01L 29/401* (2013.01); *H01L 29/4236* (2013.01); *H01L 23/5222* (2013.01)

(58) Field of Classification Search
CPC ..................... H01L 29/7827; H01L 27/10876; H01L 29/66666
USPC .......................................................... 257/330
See application file for complete search history.

(56) References Cited

U.S. PATENT DOCUMENTS

2011/0156262 A1* 6/2011 Shin .................. H01L 27/10855 257/773
2013/0093093 A1* 4/2013 Lee .................. H01L 27/10855 257/770

FOREIGN PATENT DOCUMENTS

KR 1020060128349 12/2006
KR 1020130073488 7/2013

* cited by examiner

*Primary Examiner* — Evan Pert
*Assistant Examiner* — Changhyun Yi
(74) *Attorney, Agent, or Firm* — IP & T Group LLP

(57) ABSTRACT

A semiconductor device including a storage node contact that surrounds three sidewalls of an active region to increase the contact area between the storage node contact and the active region is provided.

23 Claims, 27 Drawing Sheets

MEMORY STRUCTURE DEVICE HAVING A BURIED GATE STRUCTURE

CROSS-REFERENCES TO RELATED APPLICATION

The present application claims priority to Korean patent application number 10-2014-0057977, filed on May 14, 2014, which is incorporated by reference herein in its entirety.

BACKGROUND OF THE INVENTION

1. Technical Field

Various embodiments of the present invention relate to a semiconductor device and, more particularly, to a semiconductor device having a storage node contact and a buried gate structure.

2. Related Art

Although the demand for large capacity semiconductor devices has grown in recent years, an increase in capacity of dynamic random access devices (DRAMs) has reached its limit due to a limitation on the ability to increase chip size. When the chip size is increased, the number of chips per wafer is reduced, and thus the device fabrication productivity is reduced. Therefore, efforts to reduce cell area by changing the cell layout have been made with the goal of integrating as many memory cells into one wafer as possible.

As the semiconductor devices become more highly integrated, the size of the semiconductor devices formed on a chip are reduced. Particularly, areas of storage node contacts and bit line contacts that are formed in active regions between gates are increasingly reduced, and contact resistance is increased, resulting in electrical characteristics that are degraded.

SUMMARY

One or more exemplary embodiments of the present invention are aimed at improving electrical characteristics of semiconductor devices by reducing contact resistance of storage node contacts.

According to an embodiment of the present invention, a semiconductor device may include active regions defined by an isolation layer that is formed in a semiconductor substrate, a gate trench formed in a gate region where the active regions and the isolation layer are recessed, a buried gate formed in a lower portion of the gate trench, and a storage node contact surrounding three sidewalls of a first junction region of each active region, which is arranged in one side of the gate trench. A plurality of active regions among the active regions, which share the same buried gate, may be arranged in parallel in a row.

According to an embodiment of the present invention, a method of manufacturing a semiconductor device may include forming an isolation layer in a semiconductor substrate to define active regions arranged in parallel in a row, etching the isolation layer and the active regions to form a gate trench, forming a buried gate in a lower portion of the gate trench, and forming a storage node contact surrounding three sidewalls of a first junction region of each active region, which is arranged in one side of the gate trench.

According to an embodiment of the present invention, a processing system may include a processing unit suitable for performing data processing, a main memory device suitable for storing data to be processed by the processing unit or data processed by the processing unit, a storage device coupled to the main memory device and suitable for storing data to be processed in the main memory device or data processed in the main memory device, and a control device suitable for controlling data or a signal exchanged among the CPU, the main memory device, and the storage device. The main memory device may include active regions defined by an isolation layer that is formed in a semiconductor substrate, a gate trench formed in a gate region where the active regions and the isolation layer are recessed, a buried gate formed in a lower portion of the gate trench, and a storage node contact surrounding three sidewalls of a first junction region of each active region, which is arranged in a first side of the gate trench, wherein a plurality of active regions among the active regions, which share the buried gate, are arranged in parallel rows.

According to an embodiment of the present invention, an electronic apparatus may include a processor suitable for performing an operation on data, a dynamic random access memory (DRAM) suitable for storing data processed by the processor, a connection unit suitable for exchanging a signal between the processor and an external processing system, and an output unit suitable for outputting the data processed by the processor to an external output apparatus. The DRAM may include active regions defined by an isolation layer that is formed in a semiconductor substrate, a gate trench formed in a gate region where the active regions and the isolation layer are recessed, a buried gate formed in a lower portion of the gate trench, and a storage node contact surrounding three sidewalls of a first junction region of each active region, which is arranged in a first side of the gate trench, wherein a plurality of active regions among the active regions, which share the buried gate, are arranged in parallel rows.

According to an embodiment of the present invention, a solid state disc may include a nonvolatile memory suitable for storing data and reading the stored data, based on a control signal, a buffer memory suitable for temporarily storing data input from and outputting to the nonvolatile memory device, and a memory controller suitable for controlling data input and data output for the nonvolatile memory and the buffer memory, based on a command applied from an external (e.g. an external source or device). The buffer memory may include active regions defined by an isolation layer that is formed in a semiconductor substrate, a gate trench formed in a gate region where the active regions and the isolation layer are recessed, a buried gate formed in a lower portion of the gate trench, and a storage node contact surrounding three sidewalls of a first junction region of each active region, which is arranged in a first side of the gate trench, wherein a plurality of active regions among the active regions, which share the buried gate, are arranged in parallel rows.

According to an embodiment of the present invention, an electronic apparatus may include a processor suitable for performing an operation on data or controlling an operation of a system, a dynamic random access memory (DRAM) suitable for storing data to be processed by the processor or data processed by the processor, and an interface device suitable for exchanging a control signal or data with an external. The DRAM may include active regions defined by an isolation layer that is formed in a semiconductor substrate, a gate trench formed in a gate region where the active regions and the isolation layer are recessed, a buried gate formed in a lower portion of the gate trench, and a storage node contact surrounding three sidewalls of a first junction region of each active region, which is arranged in a first side of the gate trench, wherein a plurality of active regions among the active regions, which share the buried gate, are arranged in parallel rows.

The embodiments of the present invention may improve electrical characteristics of semiconductor devices by reducing the contact resistance of storage nodes.

These and other features, aspects, and embodiments of the present invention are described below.

BRIEF DESCRIPTION OF THE DRAWING

The above and other aspects, features and other advantages of the subject matter of the present invention will be more clearly understood from the following detailed description taken in conjunction with the accompanying drawings, in which.

DETAILED DESCRIPTION

Figure 1:
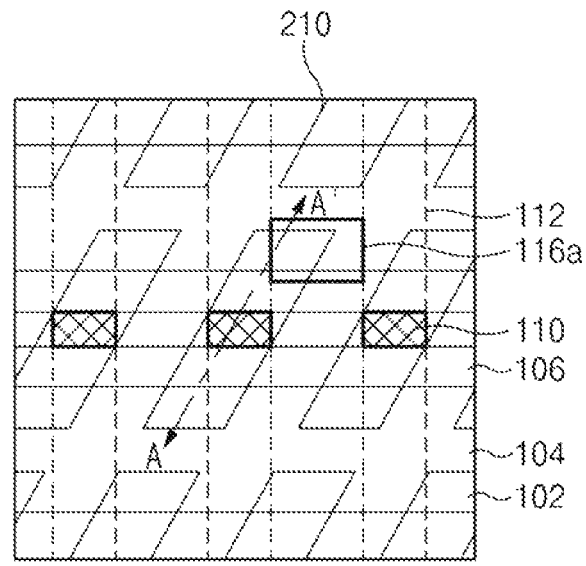
FIG. 1 is a plan view illustrating the structure of a cell array of a semiconductor device according to an embodiment of the present invention.

Hereinafter, exemplary embodiments will be described in greater detail with reference to the accompanying drawings. Like reference numerals in the drawings denote like elements, and overlapping descriptions for the same elements will be omitted.

The embodiments of the present invention described herein with reference to cross-section and/or plan illustrations that are schematic illustrations of preferred embodiments of the present invention. However, the embodiments of the present invention should not be construed as limiting the present invention. Although a few embodiments of the present invention will be shown and described, it will be appreciated by those of ordinary skill in the art that changes may be made in these exemplary embodiments without departing from the principles and spirit of the present invention. Functions or operations described in specific blocks may be performed in an order that is different from the order described and may remain within the scope of the present inventive concept. For example, two continuous blocks may be simultaneously performed, in part or in whole, or the blocks may be performed in reverse.

Figure 2:
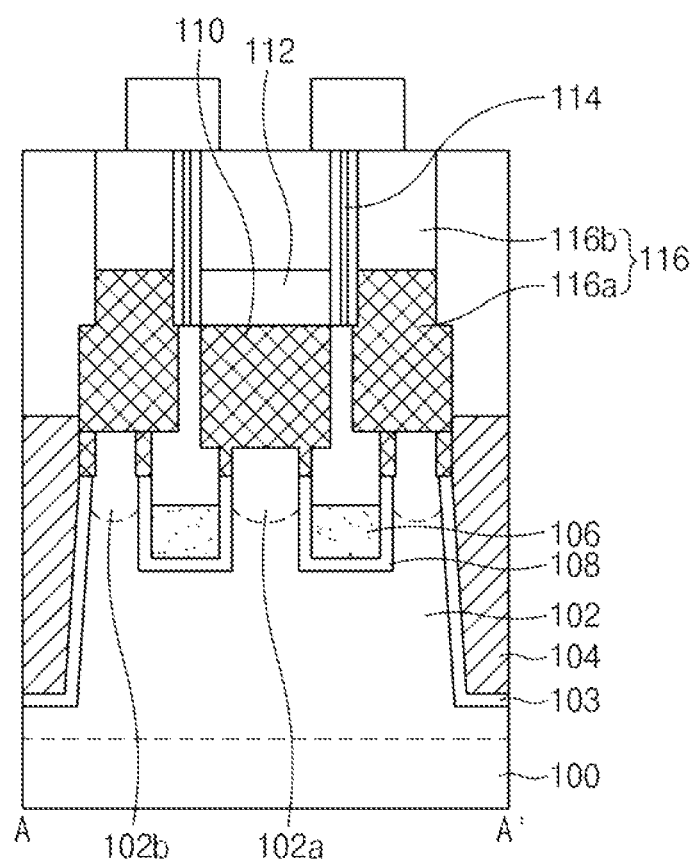
FIG. 2 is a cross-sectional view illustrating the semiconductor device taken along line A-A' of FIG. 1.

FIG. 1 is a plan view illustrating a structure of a semiconductor device according to an embodiment of the present invention, and FIG. 2 is a cross-sectional view illustrating the semiconductor device taken along line A-A' of FIG. 1.

Referring to FIGS. 1 and 2, active regions 102 are defined in a semiconductor substrate 100 by an isolation layer 104, and a wall oxide layer 103 is formed on a sidewall of each active region 102. A buried gate 106 may be formed in the active regions 102 and the isolation layer 104, and form a line extending in a first direction.

Each active region 102 intersects two buried gates 106 and one bit line 112. The buried gate 106 may perpendicularly intersect the bit line 112, and the active region 102 may obliquely intersect the buried gate 106 and the bit line 112. Particularly, in the embodiment of the present invention, active regions 102, which are arranged to be adjacent to an extending direction of the buried gate 106, share the certain two buried gates and are arranged in parallel in a row.

A bit line contact 110 is formed on a junction region 102a of the active region 102 between buried gates 106, and a bit line 112 is formed on the bit line contact 110. The bit line contact 110 is formed to contact a top of the junction region 102a and both sidewalls of the junction region 102a, that is, inner sidewalls of the gate trench. A portion of the bit line contact 110, which is in contact with the sidewalls of the junction region 102a, may be formed in a region where a gate insulating layer 108 is removed. For example, when the bit line contact is formed, a portion of the gate insulating layer 108 may be removed, and the material for the bit line contact may be formed in the corresponding region where the gate insulating layer is removed (or recessed), so that the bit line contact may be coupled to the sidewall of the junction region 102a. The bit line contact 110 may include at, least one among doped polysilicon, metal silicide, metal nitride, and metal. The bit line 112 may include a metal layer, for example, tungsten (W), or a stacking structure of a metal layer and a barrier metal layer, for example, titanium (Ti) and titanium nitride (TiN). A spacer is formed on either side of the bit line 112. The spacer may have a multi-spacer structure. For example, the spacer may include an NON structure of nitride, oxide, and nitride. Alternatively, the spacer may include an air gap 114. For example, the spacer may include an N-Air-N structure of nitride, air, and nitride.

A storage node contact 116 is coupled to a junction region 102b at either end of the active region 102. The storage node contact 116 may include a lower contact 116a and an upper contact 116b. The lower contact 116a may include polysilicon. The upper contact 116b may include a metal layer, for example, W, or a stacking structure of a metal layer and a barrier metal layer, for example, Ti and TiN. Particularly, the storage contact 116 may be formed to be in contact with the top and three sidewalls of the junction region 102b. That is, the storage node contact 116 is formed to have a structure to surround the three sidewalls of the junction region 102b. Portions of the storage node contact 116, which are in contact with the sidewalls of the junction region 102b, may be formed in regions where the wall oxide layer 103 and the gate insulating layer 108 are partially removed (or recessed). For example, when the storage node contact is formed, the wall oxide layer 103 and the gate insulating layer 108 may be partially removed, and a material for the storage node contact may be formed in the corresponding region, so that the storage node contact may be formed to be coupled to the sidewall of the junction region 102b.

FIGS. 3 to 23 are views illustrating processes for forming the semiconductor device having the structure of FIGS. 1 and 2. In FIGS. 3 to 20, 22, and 23, (i) is a plan view, and (ii) is a cross-sectional view taken along line A-A' of (i).

Figure 3:
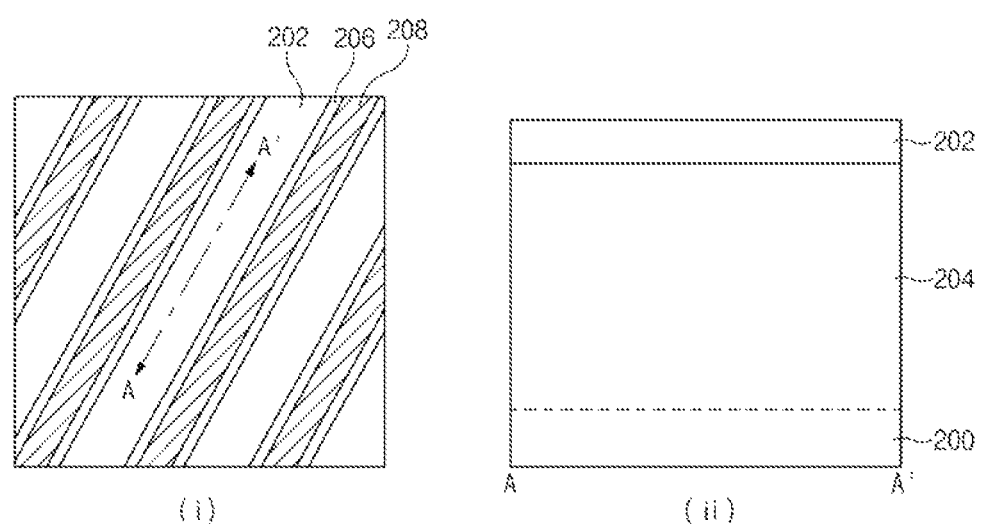
FIGS. 3 to 23 are views illustrating processes for forming the semiconductor device having the structure of FIGS. 1 and 2.

Referring to FIG. 3, a hard mask layer (not shown) is formed on a semiconductor substrate 200. The hard mask layer may include an oxide layer.

Subsequently, an isolation (ISO) mask pattern (not shown) which defines line type active regions is formed on the hard mask layer, and then the hard mask layer is etched using the ISO mask pattern as an etch mask to form a hard mask pattern 202. The ISO mask pattern may be formed through a Spacer Pattern Technology ("SPT") process. Subsequently, the semiconductor substrate 200 is etched using the hard mask pattern 202 as an etch mask to form a first isolation trench (not shown) which defines line type active regions 204. The active regions 204 may be defined to obliquely intersect bit lines and gates, that is, word lines, to be formed in subsequent processes.

A sidewall insulating layer 206 is formed on a sidewall of the first isolation trench. The sidewall insulating layer 206 may include a wall oxide layer. The sidewall insulating layer 206 may be formed by depositing an oxide material on the sidewall of the first isolation trench or oxidizing a sidewall of the first isolation trench through a dry or wet oxidation process.

An isolation layer 208, which defines the line type active region 204, is formed by forming an insulating layer to be buried within the first isolation trench and planarizing the insulating layer to expose the hard mask pattern 202. The isolation layer 208 may include a nitride layer.

Figure 4:
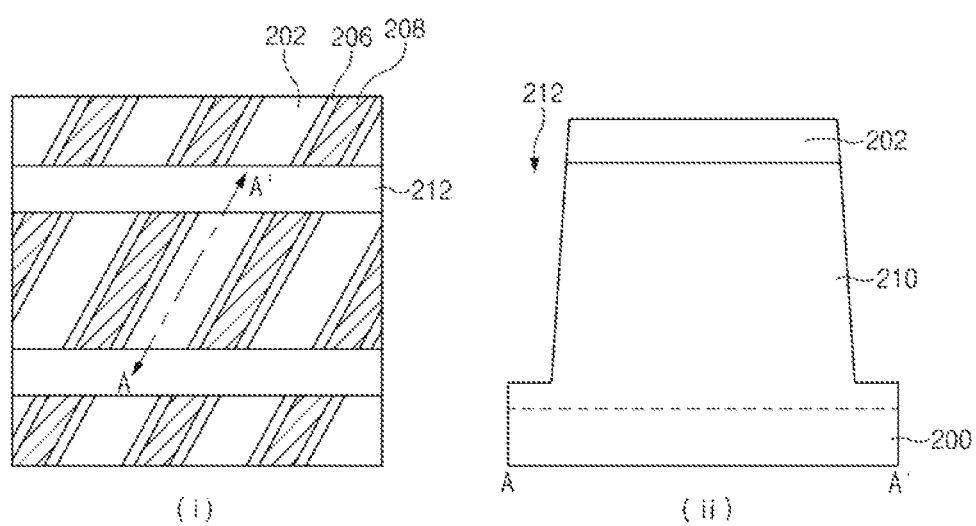
Figure 5:
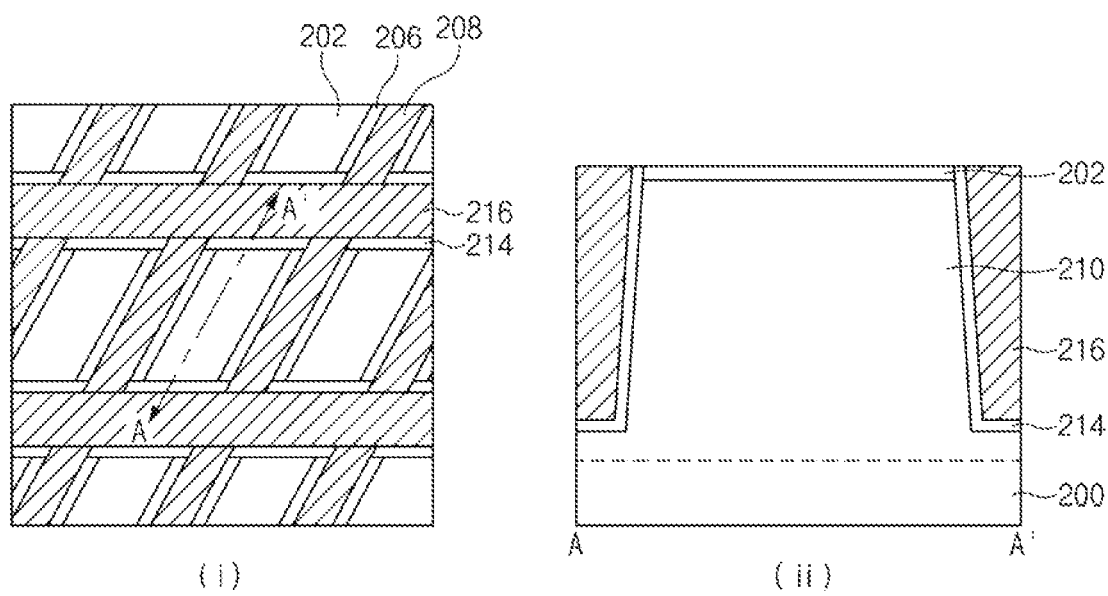

Referring to FIG. 4, the hard mask pattern 202, the active regions 204, and the isolation layer 208 are etched using an ISO cut mask for separating the active regions 204 by a certain length to form a second isolation trench 212, which defines island type active regions 210. The second isolation trench 212 is formed in a line extending in the same direction as the buried gate that will be formed in a subsequent process. Referring to FIG. 5, a sidewall insulating layer 214 is formed on a sidewall of the active region 210 exposed by the second isolation trench 212 shown in FIG. 4. The sidewall insulating layer 214 may include a wall oxide layer. The sidewall insulating layer 214 may be formed by depositing an oxide material on a sidewall of the second isolation trench 212 or oxidizing a sidewall of the second isolation trench 212 through a dry or wet oxidation process.

An isolation layer 216, which defines the active regions 210, separated by a certain length, is formed by depositing an insulating layer that is buried within the second isolation trench 212 and planarizing the insulating layer. The isolation layer 216 may include a nitride layer.

In the planarizing process, the hard mask pattern 202 may also be mostly etched.

Figure 6:
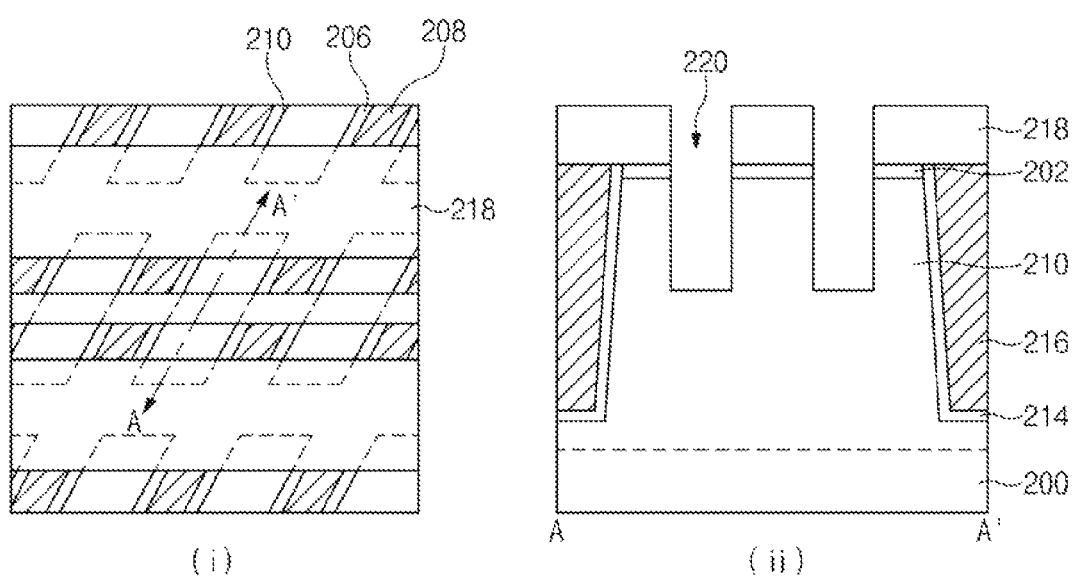

Referring to FIG. 6, a hard mask layer (not shown) is formed on the semiconductor substrate including the isolation layer 216 as illustrated in FIG. 5. The hard mask layer may include an oxide layer. A buried gate mask pattern which defines a gate region is formed on the hard mask layer, and then the hard mask layer is etched using the buried gate mask pattern as an etch mask to form a hard mask pattern 218.

Next, the active region 210 and the isolation layer 208 are etched using the hard mask pattern 218 as an etch mask to form a gate trench 220.

Figure 7:
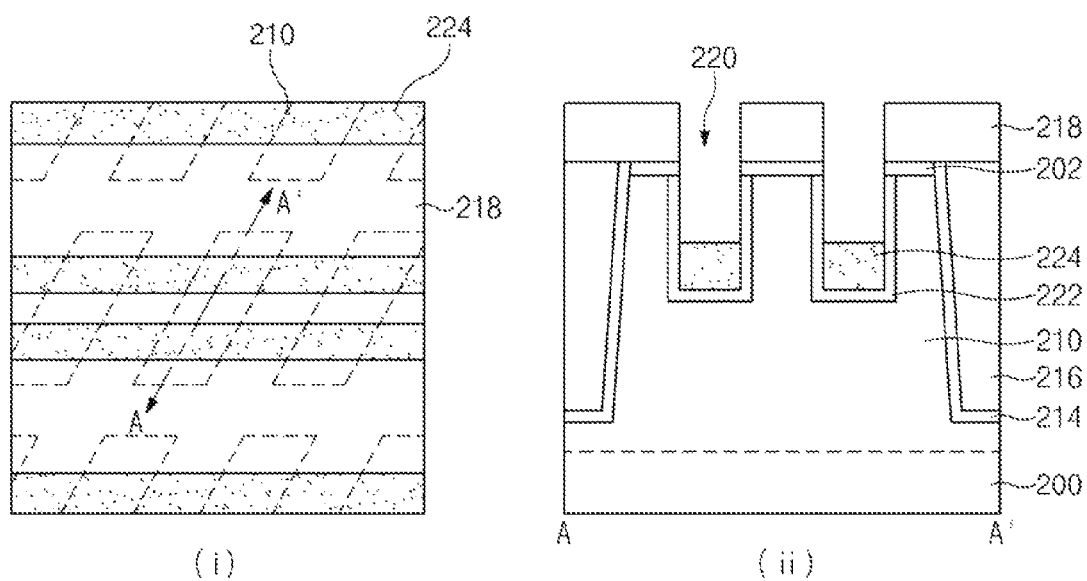

Referring to FIG. 7, a gate insulating layer 222 is formed on an inner surface of the gate trench 220. The gate insulating layer 222 may include an oxide layer, and the oxide layer may be formed of a high-k material such as silicon oxide ($SiO_2$), silicon oxynitride (SiON), hafnium oxide ($HfO_2$), or tantalum oxide ($Ta_2O_5$). The gate insulating layer 222 may be formed by depositing an oxide material on the inner surface of the gate trench 220, or oxidizing the inner surface of the gate trench 220 through a dry or wet oxidation process.

Subsequently, a conductive layer for a gate is formed on the gate insulating layer 222 to be buried within the gate trench 220, and then etched back to form a buried gate 224 in a lower portion of the gate trench 220. The conductive layer for a gate may include a metal layer, for example, W, or a stacking structure of a metal layer and a barrier metal layer, for example, Ti and TiN.

Figure 8:
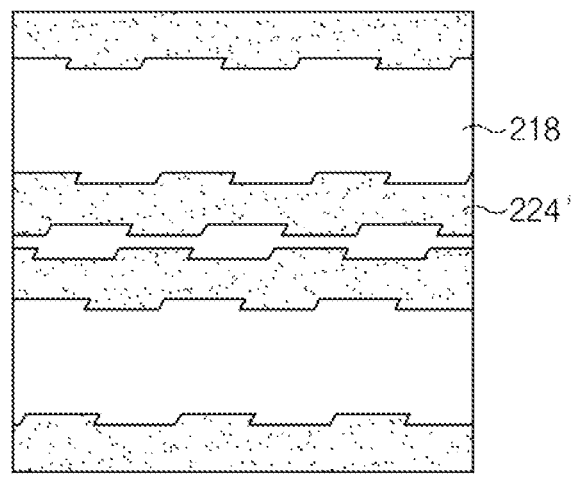
Figure 9:
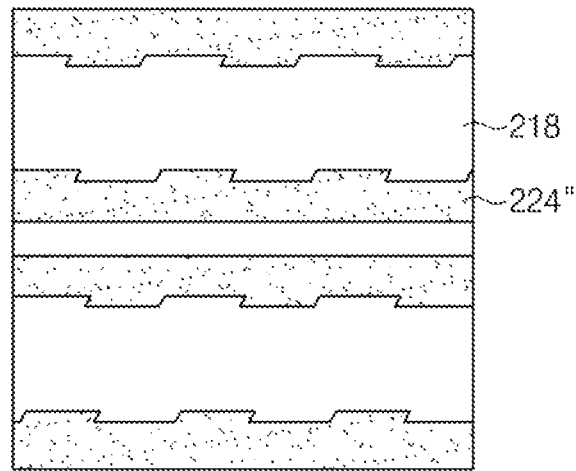

In FIG. 7, before the gate insulating layer 222 is formed, the width of the gate trench 220, which is formed in a region corresponding to the isolation layer 208 shown in FIG. 6, may be further widened using a wet widening process. For example, the gate trench 220 may be formed so that the width of a portion of the gate trench 220, formed in the region corresponding to the isolation layer 208 shown in FIG. 6, is greater than that of a portion of the trench 220 for gate formed in the active region 210. As illustrated in FIG. 8, both sides of a gate 224' may protrude in a saw-like form, and the gate 224' is formed to surround three sidewalls of the active region 210 shown in FIG. 7. Alternatively, as illustrated in FIG. 9, only one sidewall of a gate 224" may protrude in a saw-like form.

Figure 10:
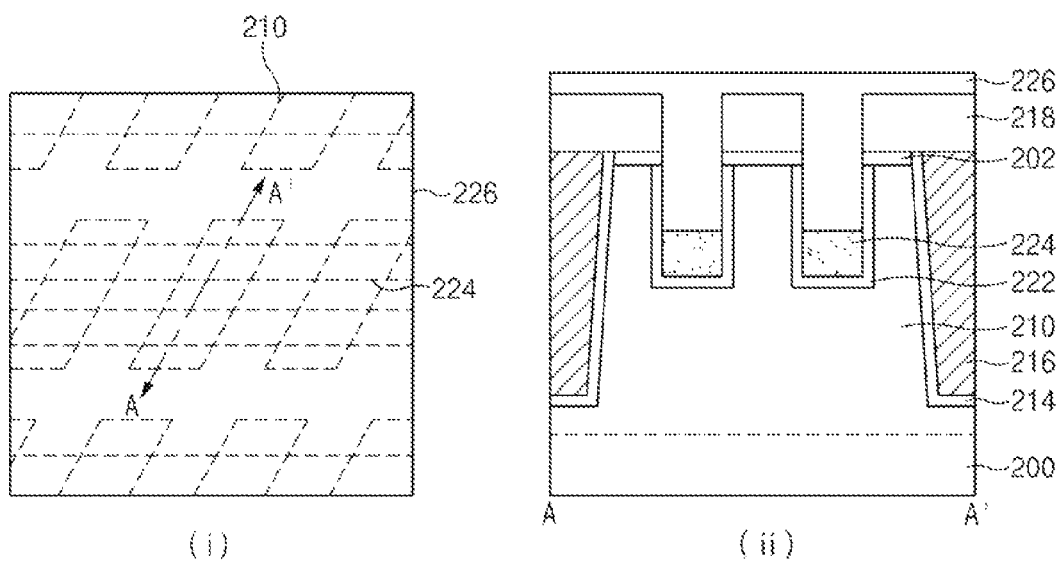

Referring to FIG. 10, a sealing layer 226 is formed to be buried within the gate trench 220, shown in FIG. 7. The sealing layer 226 may include a nitride layer. The sealing layer 226 may also be formed on the hard mask pattern 218 to function as an interlayer insulating layer.

Figure 11:
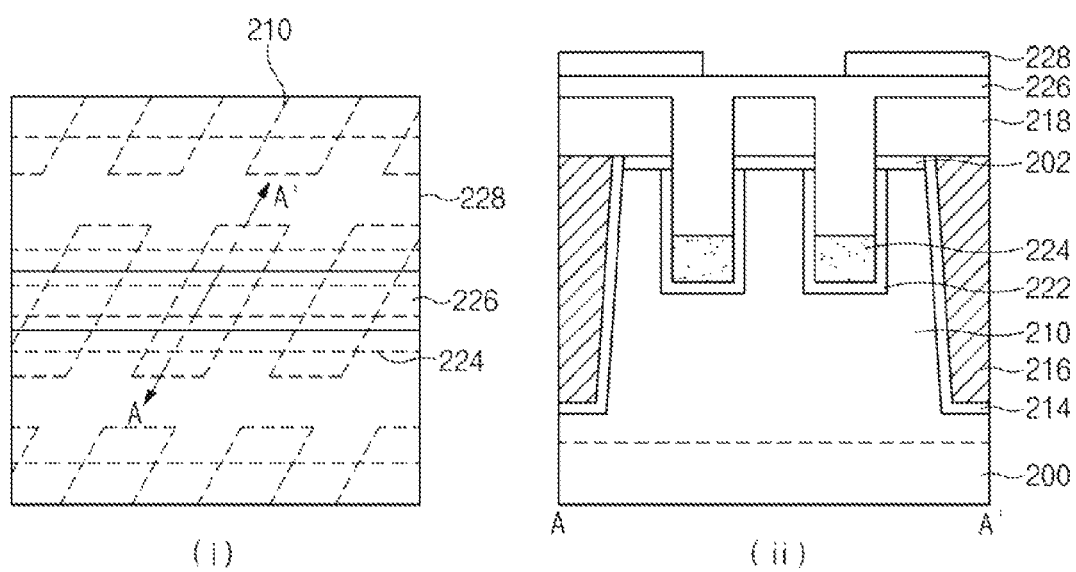

Referring to FIG. 11, a bit line contact ("BLC") mask pattern 228 exposing the sealing layer 226 is formed on the sealing layer 226 in a line form. The BLC mask pattern 228 extends in the same direction in which the gate 224 extends, and exposes the sealing layer 226 in a line form to intersect a portion of the active region 210 in which a bit line contact is to be formed.

Figure 12:
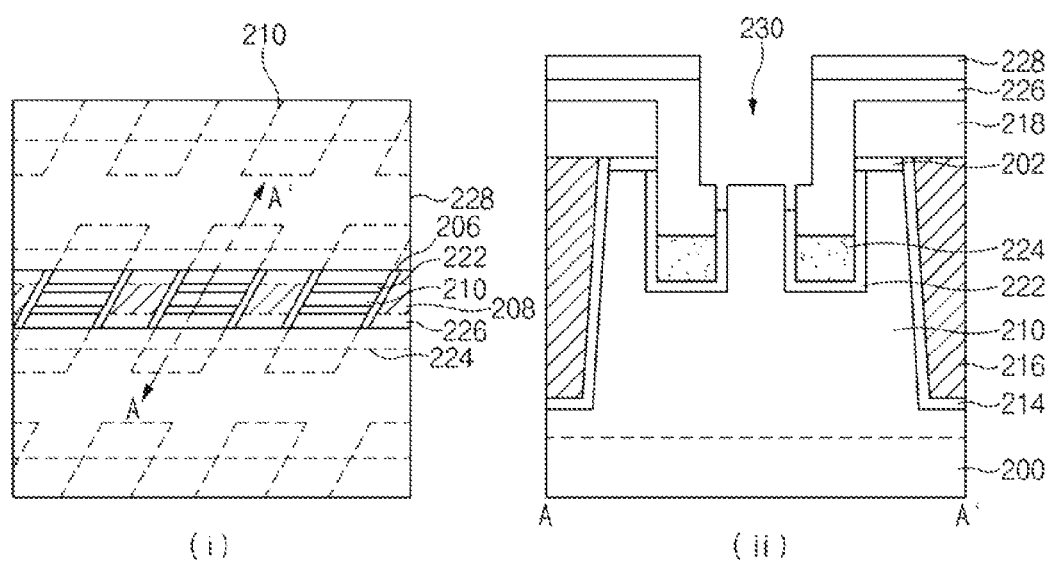

Referring to FIG. 12, the sealing layer 226, the hard mask patterns 202 and 218, the isolation layer 208, and the active region 210 are etched using the BLC mask pattern 228 as an etch mask to form a BLC trench 230. The gate insulating layer 222 and the sidewall insulating layer 206 are exposed by the BLC trench 230.

Subsequently, portions of the gate insulating layer 222 and the sidewall insulating layer 206 exposed below the trench 230 for BLC are removed through a cleaning process.

Figure 13:
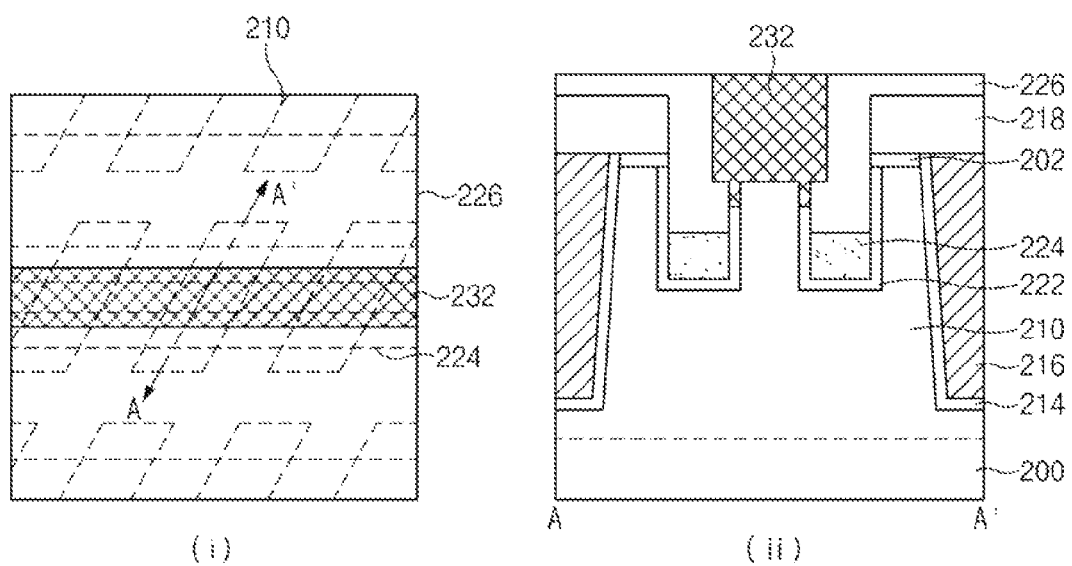

Referring to FIG. 13, a conductive layer 232 for a BLC is formed to be buried within the BLC trench 230, and then etched to planarize the conductive layer 232. The planarizing process may include a chemical mechanical polishing ("CMP") process or an etch-back process. At this time, the conductive layer 232 is also buried within regions where the gate insulating layer 222 and the sidewall insulating layer 206 are removed (or recessed). Therefore, the conductive layer 232 has a structure that in contact with the top of the active region 210 and that surrounds the sidewalls of the active region 210. The conductive layer may include doped polysilicon.

Figure 14:
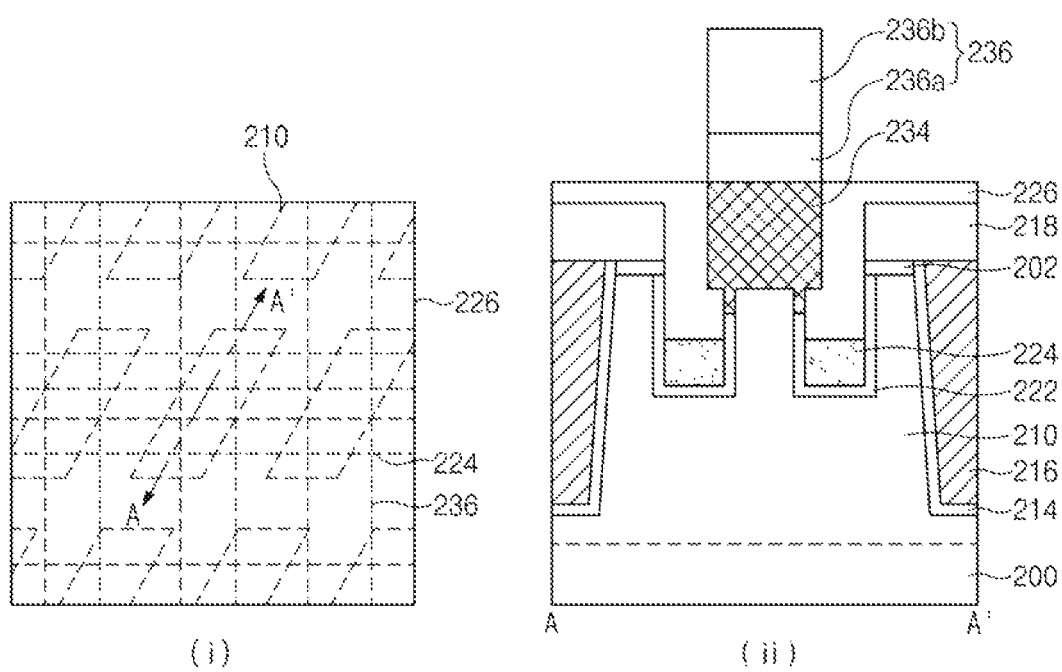

Referring to FIG. 14, a conductive layer for a bit line (not shown) and a hard mask layer (not shown) are formed on the conductive layer 232 shown in FIG. 13. The conductive layer for a bit line may include a metal layer, for example, W, or a stacking structure of a metal layer and a barrier metal layer, for example, Ti and TiN.

Subsequently, the hard mask layer, the conductive layer for a bit line, and the conductive layer 232 are sequentially etched using a mask pattern (not shown) which defines a bit line region to form a bit line 236 and a BLC 234. That is, since the conductive layer 232 is patterned when the conductive layer for a bit line is patterned to form the bit line 236, a portion of the conductive layer 232 is left only in the bit line region as the BLC 234, and the remaining portion is removed. The bit line 236 may include the conductive layer 236a and the hard mask layer 236b.

Figure 15:
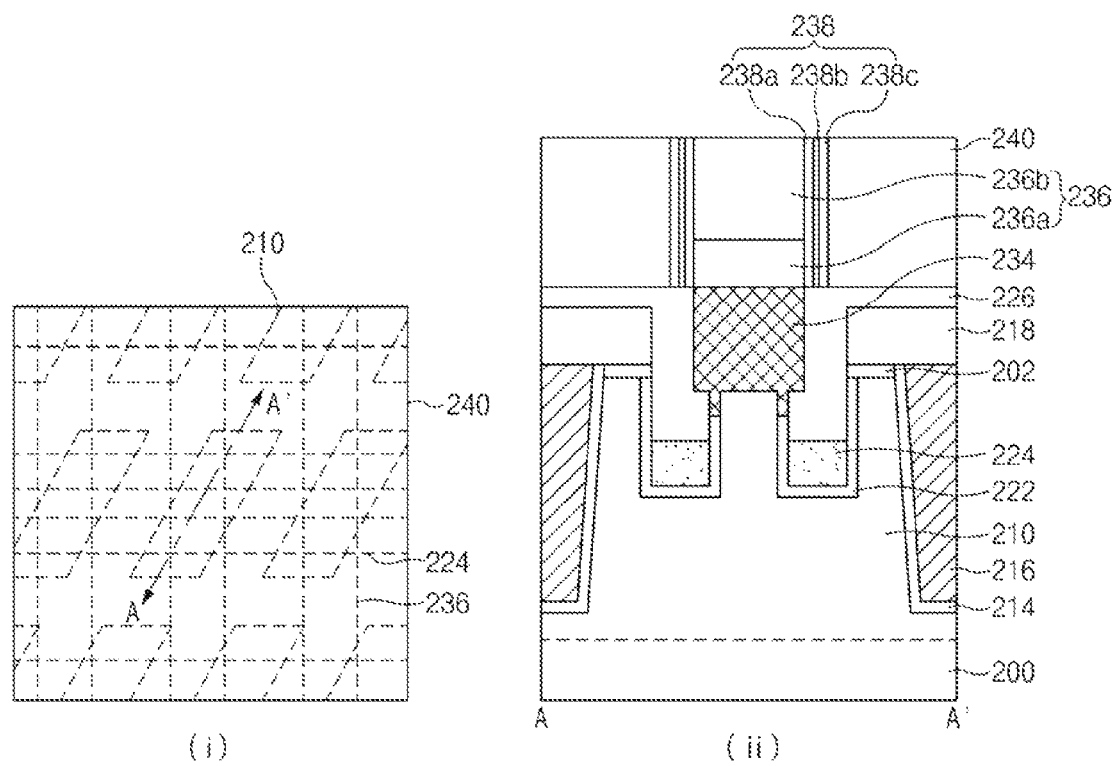

Referring to FIG. 15, a spacer 238 is formed at either side of the bit line 236. The spacer 238 may be formed in a multi-spacer structure. For example, the spacer 238 may include a nitride/oxide/nitride (NON) structure in which a nitride layer 238a, an oxide layer 238b, and a nitride layer 238c are sequentially stacked.

Subsequently, an interlayer insulating layer 240 is formed on the bit line 236, the spacer 238, and the insulating layer 226, and an annealing process and a planarization process are performed on the interlayer insulating layer 240. The interlayer insulating layer 240 may include an oxide layer, for example, a spin on dielectric ("SOD") material layer. For clarity, the spacer 238 is not illustrated in FIG. 15(i).

Figure 16:
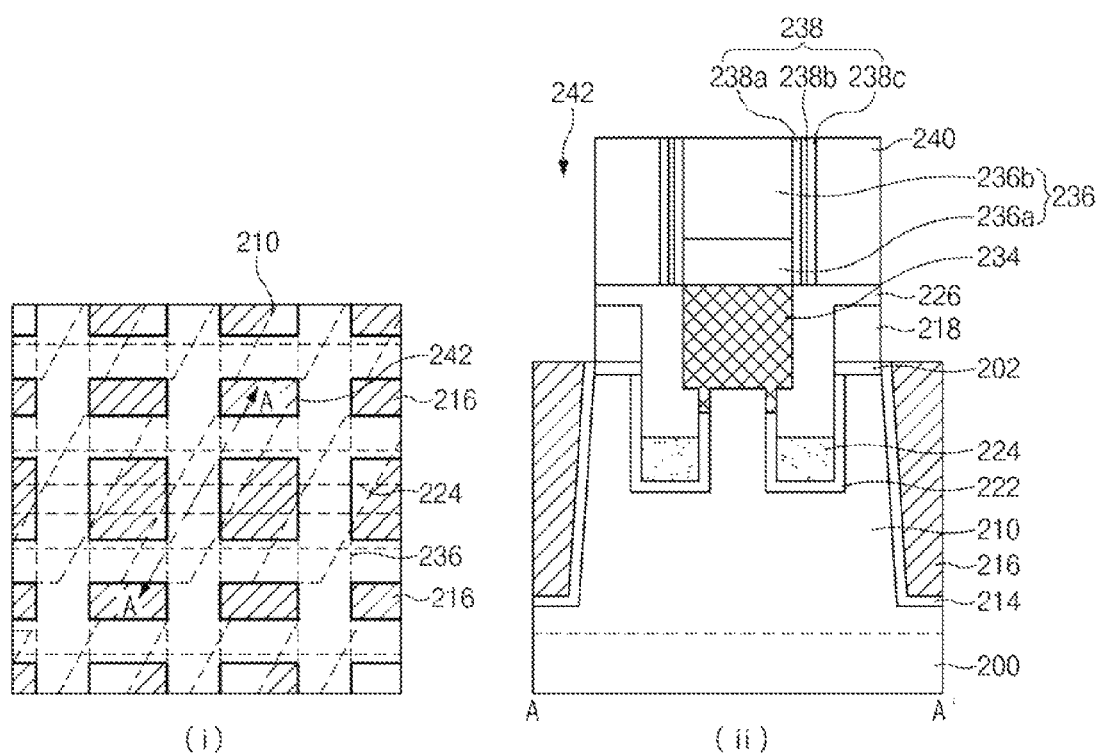

Referring to FIG. 16, a storage node contact ("SNC") damascene trench 242 is formed by etching the layers in a region between bit lines 236 other than an SNC region until the isolation layers 208, shown in FIG. 12, and 216 or the sealing layer 226 are exposed. A portion indicated by a bold-lined box in FIG. 16 is a region in which the SNC damascene trench 242 is formed.

Figure 17:
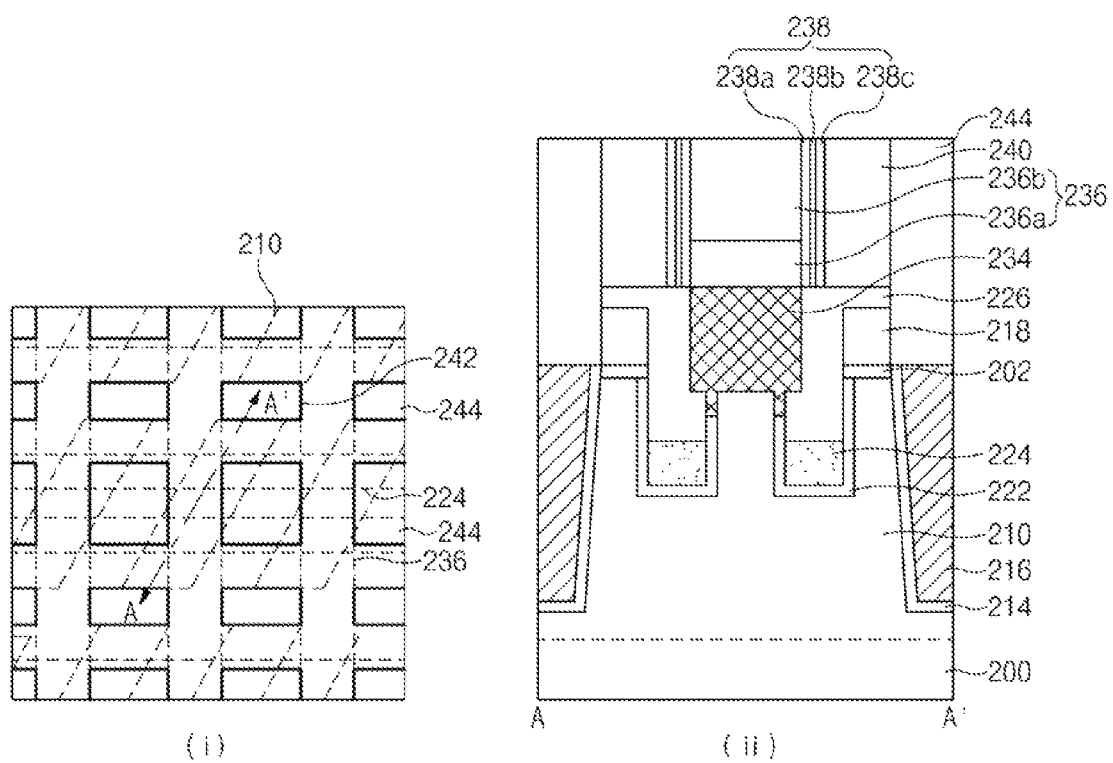

Referring to FIG. 17, to form a SNC damascene pattern 244, an insulating layer is buried within the SNC damascene trench 242, and then planarized to expose the interlayer insulating layer 240. The SNC damascene pattern 244 may include a nitride layer.

Figure 18:
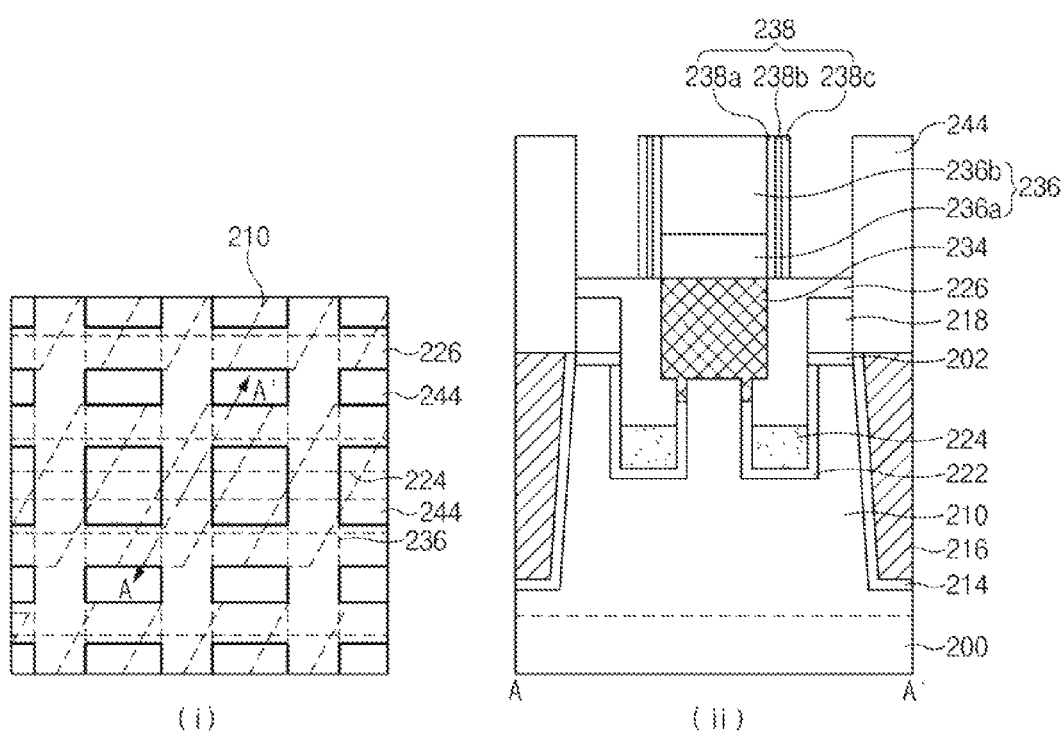

Referring to FIG. 18, the interlayer insulating layer 240, shown in FIG. 17 is selectively removed using etch selectivity of the hard mask layer 236b of the bit line 236, the interlayer insulating layer 240, and the SNC damascene pattern 244. The interlayer insulating layer 240 may be removed through a dip out process. That is, since the hard mask layer 236b of the bit line 236 and the SNC damascene pattern 244 includes a nitride layer, and the interlayer insulating layer 240 includes an oxide layer, only the interlayer insulating layer 240 is selectively removed using the etch selectivity of the nitride layer and the oxide layer. The oxide layer 238b that is part of the spacer 238 is not removed since the width of the oxide layer 238b is far narrower than that of the interlayer insulating layer 240.

Figure 19:
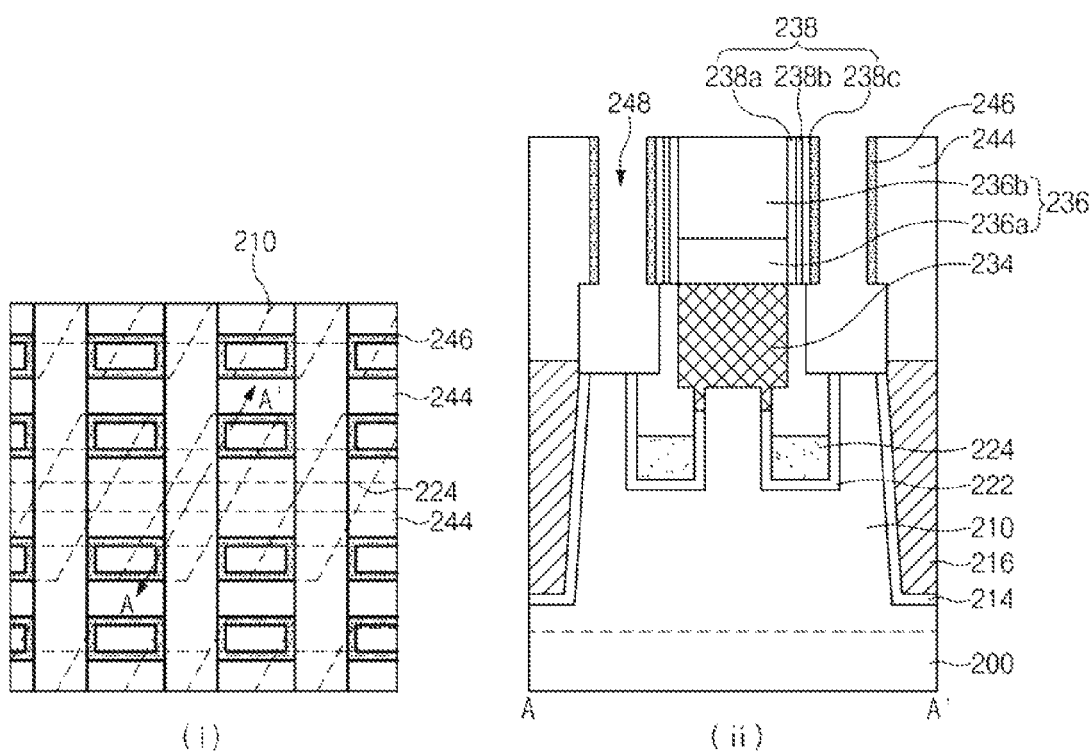

Referring to FIG. 19, a spacer 246 is formed on a side of a trench where the interlayer insulating layer 240 is removed. The spacer 246 may include TiN.

Subsequently, an SNC hole 248 is formed by etching the layers below the trench by using the spacer 246 as an etch-barrier layer to expose the active region 210. Portions of the isolation layer 216 and the sealing layer 226 shown in FIG. 18, adjacent to the active region 210, are also removed using a trimming process. That is, a lower portion of the SNC hole 248 is formed to be wider than the active region 210. Thus, the active region 210 as well as the sidewall insulating layer 214 and the gate insulating layer 222, located on a sidewall of the active region 210, are also exposed.

Figure 20:
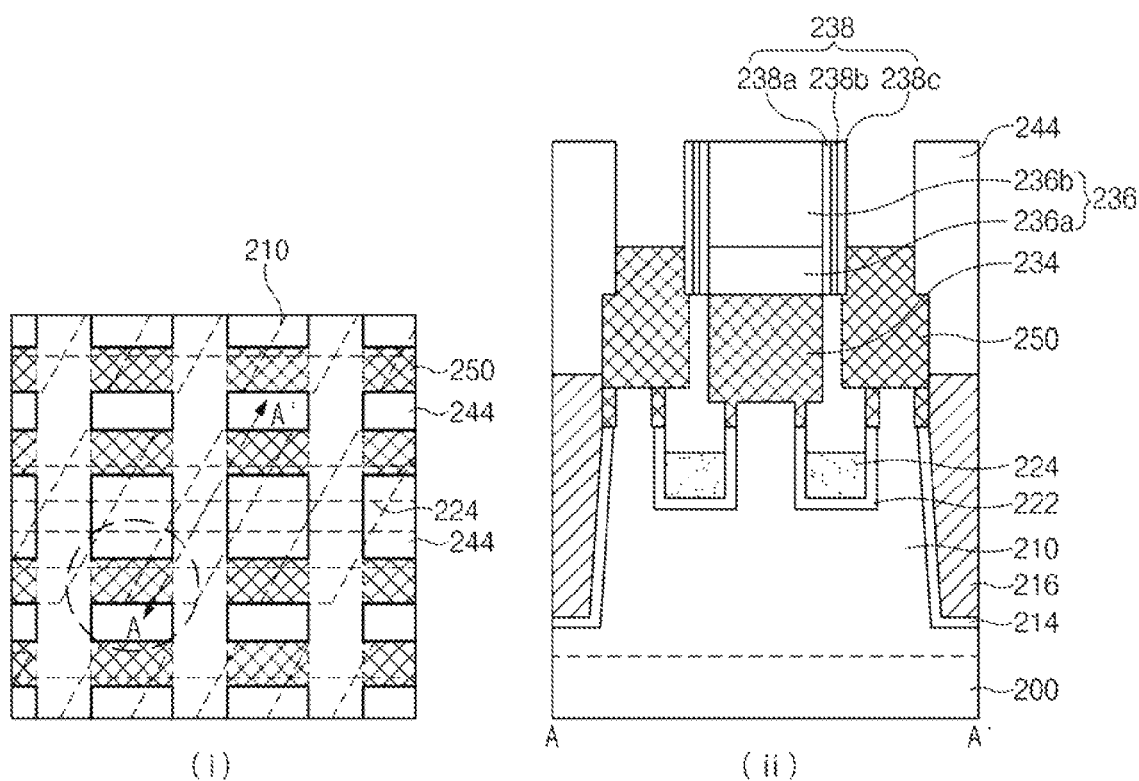

Referring to FIG. 20, a cleaning process is performed on the SNC hole 248, shown in FIG. 19, to remove portions of the sidewall insulating layer 214 and the gate insulating layer 222 exposed by the SNC hole 248. Subsequently, the spacer 246, shown in FIG. 19, is removed through a strip process.

Next, a conductive layer for a contact is formed to be buried within the SNC hole 248, and then etched back to form a lower contact 250. The conductive layer for a contact may include polysilicon. The lower contact 250 is also formed in regions from which the sidewall insulating layer 214 and the gate insulating layer 222 are removed, and thus the lower contact 250 is formed to surround the three sidewalls of the active region 210.

Figure 21:
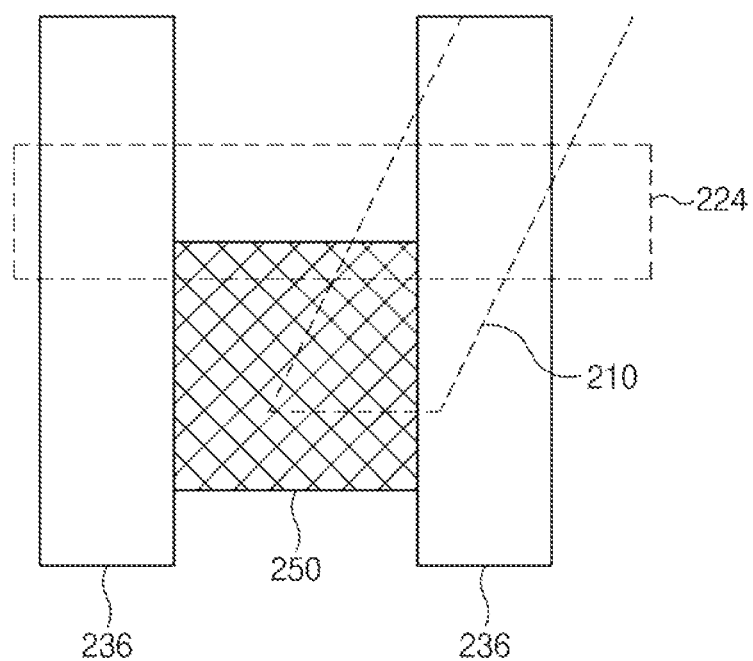

FIG. 21 is a view illustrating in detail a region indicated by the dotted circle in FIG. 20. FIG. 21 illustrates the relationship among the active region 210, the gate 224, the bit line 236, and the lower contact 250 in more detail.

As illustrated in FIG. 21, the lower contact 250 expands to a region corresponding to the gate 224 and a region corresponding to the isolation layer 216 shown in FIG. 20. Particularly, after the portions of the sidewall insulating layer 214, shown in FIG. 20, and the gate insulating layer 222, shown in FIG. 20, of corresponding regions are removed, the conductive layer for a contact is formed in the regions from where the sidewall insulating layer 214 and the gate insulating layer 222 are removed, and thus the lower contact 250 has a structure to surround the three sidewalls of the active region 210.

Figure 22:
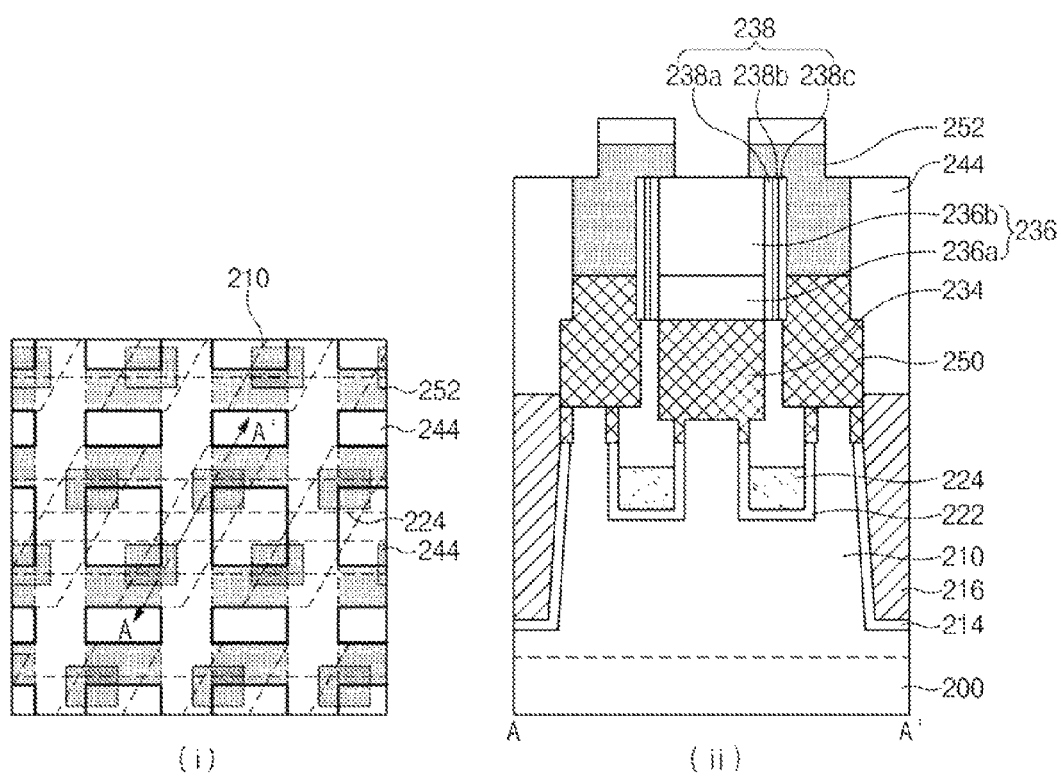

Referring to FIG. 22, a conductive layer (not shown) is formed on the lower contact 250 and the SNC damascene pattern 244 to be buried within the SNC hole 248 shown in FIG. 19, and a hard mask layer (not shown) is formed on the conductive layer. The conductive layer may include a metal layer, for example, W, or a stacking structure of a metal layer and a barrier metal layer, for example, Ti and TN.

Subsequently, an upper contact 252 is formed by etching the conductive layer and the hard mask layer to expose the SNC damascene pattern 244. That is, the conductive layer and the hard mask layer, formed on the SNC damascene pattern 244, are patterned to form the upper contact 252. A portion of the upper contact 252, which is buried within the SNC hole 248, and a remaining portion of the upper contact 252, only partially overlap each other. That is, the location for the portion of the upper contact 252 coupled to the lower contact 250 is formed to be misaligned with the location for a portion of the upper contact 252 which is coupled to a storage node to be formed in a subsequent process, so that the process margin may be increased in the storage node formation process.

Figure 23:
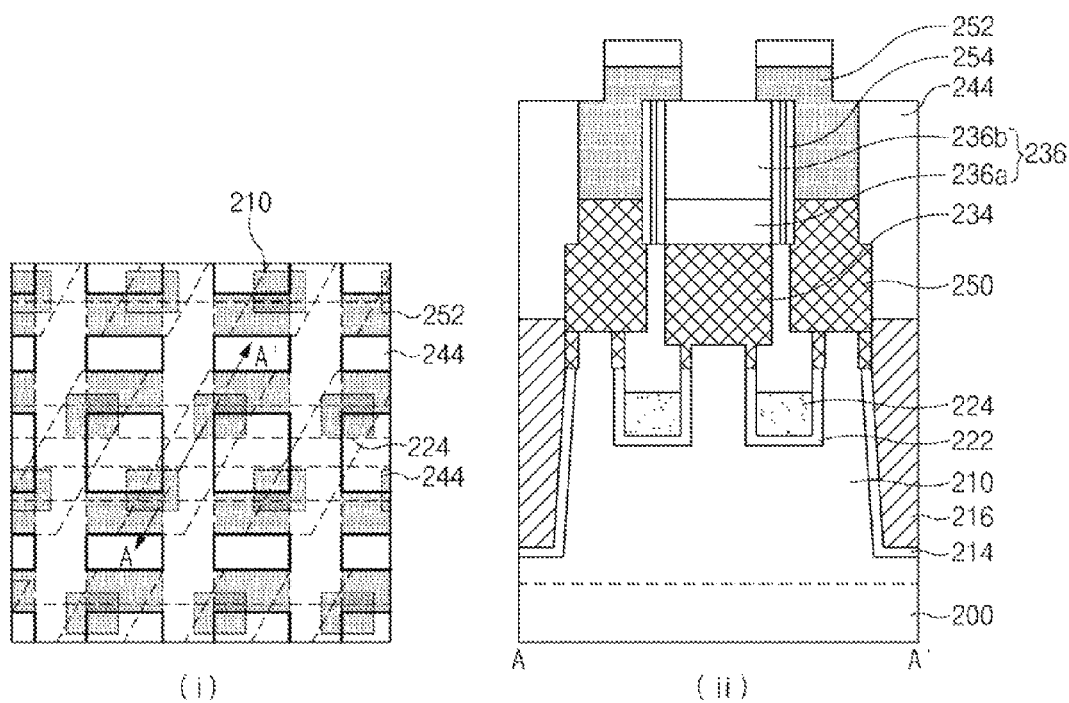

Referring to FIG. 23, the oxide layer 238b of the spacer 238, shown in FIG. 22, having a multi-spacer structure may be selectively removed to form an air gap 254 at either side of the bit line 236. The air gap 254 may be selectively formed. That is, the multi-spacer 238 may be formed in an NON structure or in an N-air-N structure.

Subsequently, additional processes such as the process of forming a storage node coupled to the upper contact 252 may be performed through the same processes as used in general processes, and thus a detailed description thereof will be omitted.

Figure 24:
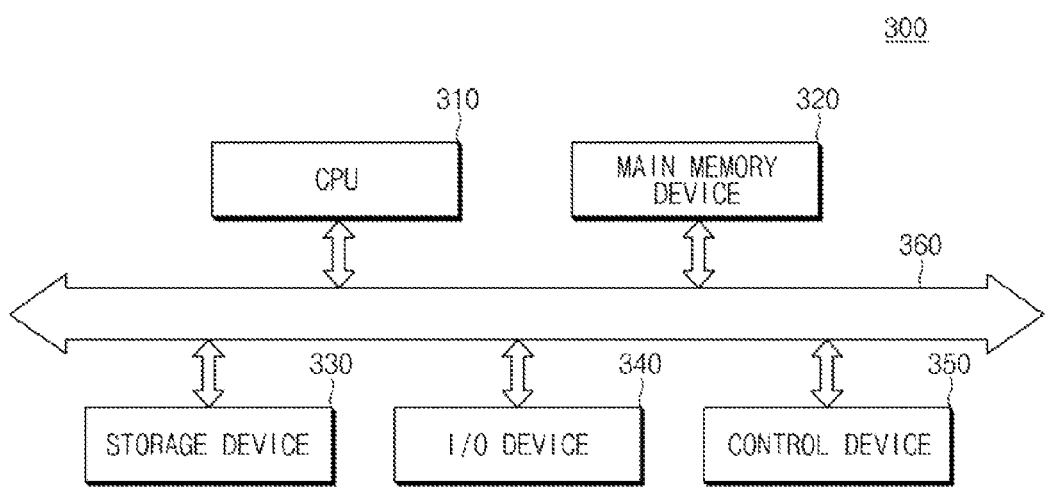
FIG. 24 is a block diagram schematically illustrating the configuration of a processing system according to an embodiment of the present invention.

FIG. 24 is a block diagram schematically illustrating configuration of a processing system according to an embodiment of the present invention.

Referring to FIG. 24, a processing system 300 may include a central processing unit ("CPU") 310, a main memory device 320, a storage device 330, an input/output ("I/O") device 340, and a control device 350. Information exchange among the CPU 310, the main memory device 320, the storage device 330, and the I/O device 340, and the control device 350 may be performed through a system bus 360.

The CPU 310 may perform program execution and data processing in the processing system 300. For example, the CPU 310 may include a register, an arithmetic logic unit (ALU), a control device, or the like. The CPU 310 may one-directionally transmit information related to an address, data, or a control signal to the main memory device 320, the storage device 330, or the I/O device 340 using the system bus 360. Alternatively, the CPU 310 may bidirectionally exchange the information related to the address, the data, or the control signal with the main memory device 320, the storage device 330, or the I/O device 340 using the system bus 360.

The main memory device 320 may function to retain data to be processed by the CPU 310 or to store a result processed by the CPU 310. Further, the main memory device 320 may store data input from the I/O device 340, or retain data to be output to the I/O device 340. For example, the main memory device 320 may include a volatile memory device such as a dynamic random access memory ("DRAM").

The main memory device 320 may include a plurality of cells which store data in bit units. Further, the main memory device 320 may include a semiconductor device having the above-described structure as illustrated in FIGS. 1 and 2. For example, in the main memory device 320, active regions arranged adjacently along an extending direction of a buried gate share the certain two buried gates and are arranged in parallel in a row. Further, the SNC of the semiconductor device has a structure that is in contact with a top of the junction region and simultaneously surrounds three sidewalls of the junction region.

The storage device 330 may separately store data to assist the function of the main memory device 320. For example, after the storage device 330 stores data to be processed in the main memory device 320, the storage device 33 may provide required data to the main memory device 320 when it is required. The storage device 330 may include a magnetic tape, a magnetic disc such as a floppy disc or a hard disc, a compact disc-read only memory (CD-ROM), an optical disc such a laser disc or a digital versatile disc (DVD), a flash memory, a solid state disc (SSD), universal serial bus (USB) memory, a secure digital (SD) card, a mini secure digital (mSD) card, a micro SD card, a secure digital high capacity (SDHC) card, a memory stick card, a smart media (SM) card, a multimedia card (MMC), an embedded MMC (eMMC), a compact flash card (CF), or the like.

The I/O device 340 is a device which performs input of data to be processed by the CPU 310 or output of data processed by the CPU 310. The I/O device 340 may include an interface device such as a key pad, a key board, a mouse, a speaker, a microphone, a display, a printer, a graphic card, or a communication device. The communication unit may include a module to be connected to a wired network, a module to be connected to a wireless network, or a combination thereof. The wired network module may include various devices which exchange data through a transmission line such as a local area network (LAN), a USB, Ethernet, or power line communication (PLC). The wireless network module may include various devices which exchange data without a transmission line such as Infrared Data Association (IrDA), a wireless LAN, Zigbee, a Ubiquitous Sensor Network (USN), Bluetooth, Radio Frequency Identification (RFID), Near Field Communication (NFC), or Wireless Broadband Internet (Wibro).

The control device 350 may control data or a signal which is exchanged between the CPU 310 and other devices 320, 330, and 340. The control device 350 may be a north bridge chip or a south bridge chip that is inside of a computer. The system bus 360 may function as a path in which a signal moves among the CPU 310, the main memory device 320, the storage device 330, the I/O device 340, and the control device 350. For example, the system bus 360 may include an address bus, a data bus, and a control bus.

The processing system of FIG. 24 may include a main board which is a printed circuit board ("PCB"). The CPU 310, the main memory device 320, and the control device 350 may be formed to be mounted on the main board. In an embodiment of the present invention, the CPU 310 or the control device 350 may be mounted on the main board in a semiconductor package form. The main memory device 320 may be coupled to the main board in a package module form. The main board may be a multi-layered circuit board. The storage device 330 and the I/O device 340 may be prepared in separate products, and may be coupled to an I/O interface device disposed in the main board. The system bus 360 may be implanted with integrated circuits inside of the main memory device 320, the storage device 330, the I/O device 340, the control device 350, and the CPU 310 or an integrated circuit within the main board.

As a result, the processing system, according to the embodiment of the present invention, may include the main memory device including a semiconductor package employing a semiconductor device according to the embodiment of the present invention or a package module including the semiconductor package. Thus, electrical characteristics of the main memory device may be improved and in turn improve the processing rate or data reliability. Therefore, the performance of the processing system may be improved as a whole.

Figure 25:
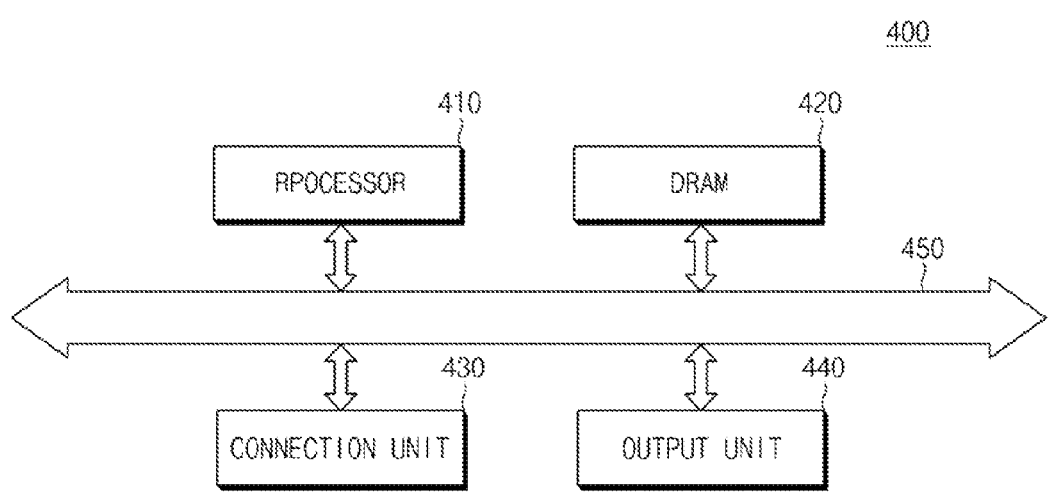
FIG. 25 is a block diagram schematically illustrating the configuration of an electronic apparatus according to an embodiment of the present invention.

FIG. 25 is a block diagram schematically illustrating the configuration of an electronic apparatus according to an embodiment of the present invention.

Referring to FIG. 25, an electronic apparatus 400 may include a processor 410, a DRAM 420, a connection unit 430, and an output unit 440. Information exchange among the processor 410, the DRAM 420, the connection unit 430, and the output unit 440 may be performed through a system bus 450.

The processor 410 may perform operations to process and accelerate various image signals, or the like. The processor 410 may include a graphic processor unit (GPU).

The DRAM 420 may function to retain image data to be processed by the processor 410 or to store a result processed by the processor 410. The DRAM 420 may include a plurality of cells which store image data in bit units. Further, the DRAM 420 may include a semiconductor device having the above-described structure as illustrated in FIGS. 1 and 2. For example, in the DRAM 420, active regions arranged adjacently along an extending direction of a buried gate share the certain two buried gates and are arranged in parallel in a row. Further, the SNC of the semiconductor device has a structure that is in contact with a top of the junction region and simultaneously surrounds three sidewalls of the junction region.

The connection unit 430 is an interface device which gives the electronic apparatus 400 access to an external processing system, such as a computer system, and exchanges a control signal and data with a CPU of the external processing system. The connection unit 430 may be an accelerated graphic port (AGP) type or a peripheral component interconnect (PCI) type.

The connection unit 440 may output arithmetically processed image data to an external output apparatus such as a display apparatus.

The electronic apparatus 400 of FIG. 25 may be implemented with a graphic card, and include a main board which is a PCB. The processor 410 and the DRAM 420 may be mounted on the main board. In an embodiment of the present invention, the processor 410 or the DRAM 420 may be mounted on the main board in a semiconductor package form. The main board may be a multi-layered circuit board.

The connection unit 430 and the output unit 440 may include I/O interface devices disposed in the main board. The system bus 450 may be implanted with integrated circuits inside of the processor 410, the DRAM 420, the connection unit 430, or the output unit 440, or an integrated circuit within the main board.

As a result, the electronic apparatus, that is, a graphic card, according to an embodiment of the present invention may include a DRAM employing a semiconductor device according to the embodiment of the present invention. Thus, electrical characteristics of the DRAM may improve the processing rate or data reliability. Therefore, the performance of the graphic card may be improved as a whole.

Figure 26:
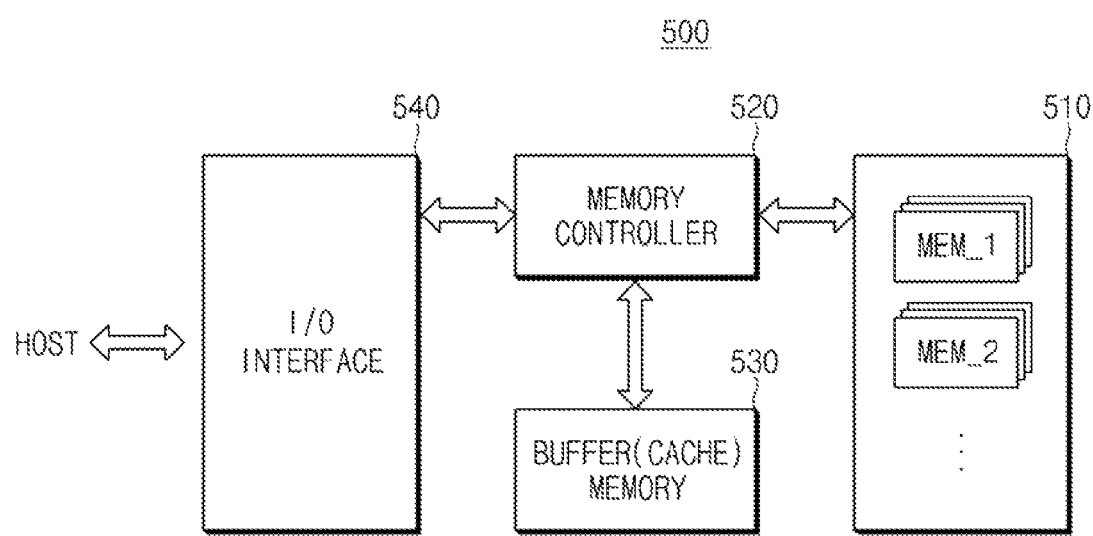
FIG. 26 is a block diagram schematically illustrating the configuration of an electronic apparatus according to another embodiment of the present invention.

FIG. 26 is a block diagram schematically illustrating a configuration of an electronic apparatus according to another embodiment of the present invention.

Referring to FIG. 26, an electronic apparatus 500 may include a data storage unit 510, a memory controller 52, a buffer (cache) memory 530, and an I/O interface 540.

The data storage unit 510 stares data DATA applied from the memory controller 520, and reads the stored data and outputs the read data to the memory controller 520, according to a control signal from the memory controller 520. The data storage unit 510 may include nonvolatile memory which continuously stores data without data loss even without power. For example, the data storage unit 510 may include a NOR flash memory, a NAND flash memory, a phase-change random access memory (PRAM), a resistive RAM (RRAM), a spin transfer torque RAM (STTRAM), a magnetic RAM (MRAM) or the like.

The memory controller 520 decodes a command which is applied from an external apparatus, for example, a host, through the I/O interface 540, and controls data input/output with respect to the data storage unit 510 and the buffer memory 530 according to a decoding result. In FIG. 26, although the memory controller 520 is indicated by one block, the memory controller 520 may be configured as a controller which controls the data storage unit 510 as a nonvolatile memory, and a controller which controls the buffer memory 530 as a volatile memory may be independently formed.

The buffer memory 530 temporarily stores data to be processed in the memory controller 520, that is, data input from/output to the data storage unit 510. The buffer memory 530 stores data DATA applied from the memory controller 520, and reads the stored data and outputs the read data to the memory controller 520, according to a control signal from the memory controller 520. The buffer memory 530 may include a volatile memory such as a DRAM, a mobile DRAM, or a static random access memory (SRAM).

The I/O interface 540 provides physical connection between the memory controller 520 and the external apparatus to receive a control signal for data input from/output to an external apparatus, and to exchange data with the external apparatus. The I/O interface 540 may include at least one of various interface protocols such as a USB, an MMC, peripheral component interconnect-Express (PCI-E), Serial Attached SCSI (SAS), Serial Advanced Technology Attachment (SATA), Parallel Advanced Technology Attachment (DATA), a Small Computer System Interface (SCSI), an Enhanced Small Device Interface (ESDI), or Integrated Device Electronics (IDE).

In the electronic apparatus 500, the data storage unit 510 or the buffer memory 530 may include a semiconductor device having the above-described structure as illustrated in FIGS. 1 and 2. In the semiconductor device, active regions arranged adjacently along an extending direction of a buried gate share the certain two buried gates and are arranged in parallel in a row. Further, the SNC of the semiconductor device has a structure that is in contact with a top of the junction region and simultaneously surrounds three sidewalls of the junction region.

The electronic apparatus 500 of FIG. 26 may be used for an auxiliary memory device of a host apparatus or an external storage apparatus. The electronic apparatus 500 may include an SSD, a USB memory, an SD card, an mSD card, a micro SD card, an SDHC card, a memory stick card, an SM card, an MMC, an eMMC, a CF, or the like.

As a result, the electronic apparatus according to an embodiment of the present invention may employ the semiconductor device of FIGS. 1 and 2 to improve the processing rate or data reliability. Therefore, performance of the electronic apparatus may be improved as a whole.

Figure 27:
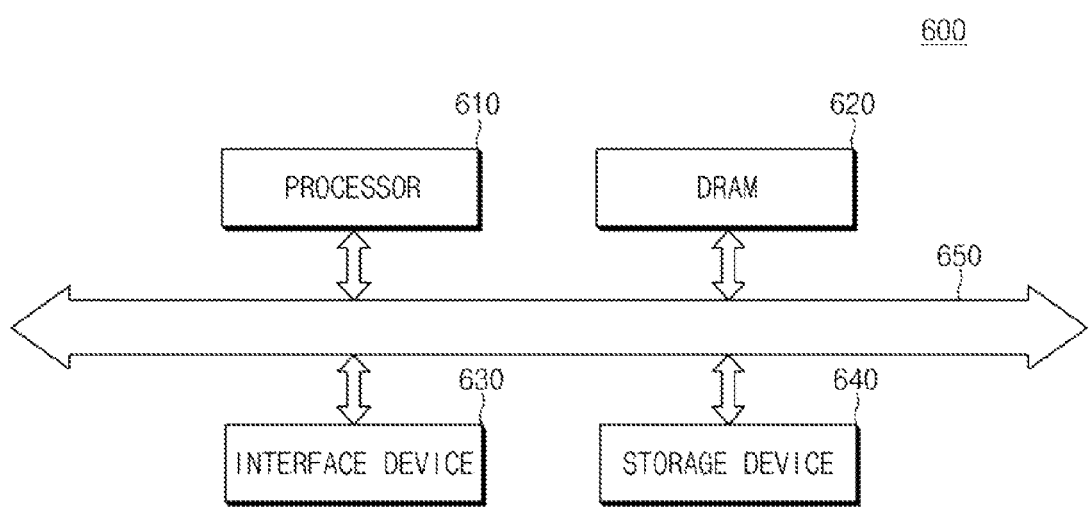
FIG. 27 is a block diagram schematically illustrating the configuration of an electronic system according to an embodiment of the present invention.

FIG. 27 is a block diagram schematically illustrating the configuration of an electronic system according to an embodiment of the present invention.

Referring to FIG. 27, an electronic system 600 may include a processor 610, a DRAM 620, an interface device 630, and a storage device 640. Information exchange among the processor 610, the DRAM 620 the interface device 630, and the storage device 640 may be performed through a system bus 650.

The processor 610 may perform various operations according to the kind of electronic system 600 or it may control other components 610, 620, 630, and 640 of the electronic system 600. For example, the processor 610 may perform program execution and various other kinds of operations requested by the electronic system 600.

The DRAM 620 may function to receive data to be processed by the processor 610 from the storage device 640 and retain the data or it may temporarily store a result processed by the processor 610. The DRAM 620 may function as a buffer which increases the processing rate of the processor 610 of the electronic system 600.

The DRAM 620 may include a plurality of cells which store data in bit units. Further, the DRAM 620 may include a semiconductor device having the above-described structure as illustrated in FIGS. 1 and 2. For example, in the DRAM 420, active regions arranged adjacently along an extending direction of a buried gate share the certain two buried gates and are arranged in parallel in a row. Further, the SNC of the semiconductor device has a structure that is in contact with a top of a junction region and simultaneously surrounds three sidewalls of the junction region. The contact resistance of the SNC may be reduced through the structure, and thus operation characteristics of the semiconductor device may be improved.

The interface device 630 exchanges a control signal, data, or the like between the system of an embodiment of the present invention and an external apparatus. The interface device 640 may be various kinds of display devices, an audio device, a microphone, a touch screen, a key pad, a key board, a mouse, a user interface device, or various kinds of wired or wireless communication devices.

The storage device 640 may store data to be processed by the processor 610 or data processed by the processor 610. The storage device 640 may be nonvolatile and provide data so that the data may be sequentially processed in the processor 610 through incorporation with the DRAM 620. In some embodiments of the present invention, the electronic systems 600 may be configured to include the processor 610, the DRAM 620, and the interface device 630 without the storage device 640.

The electronic system 600 of FIG. 27 may include a main board which is a PCB. The processor 610 or the DRAM 620 may be mounted on the main board in a semiconductor package form. The DRAM 620 may be coupled to the main board in a package module form. The interface device 630 or the storage device 640 may be manufactured in separate products, and may be coupled to the electronic system 600 to exchange a signal with the main board. The system bus 650 may be implanted with integrated circuits inside of the processor 610, the DRAM 620, the interface device 630, or the storage device 640 or an integrated circuit within the main board.

The electronic system of FIG. 27 may include various kinds of electronic systems which operate using a processor, such as a personal computer, a server, a personal digital assistant (PDA), a portable computer, a web tablet, a wireless phone, a mobile phone, a smart phone, a digital music player, a portable multimedia player (PMP), an enterprise digital assistant (EDA), a digital still camera, a digital video camera, a global positioning system (GPS), a voice recorder, a Telematics, an audio visual (AV) system, a smart television, or other embedded systems.

As a result, the electronic system according to the embodiment of the present invention may include a DRAM employing the semiconductor device according to an embodiment of the present invention. Thus, the processing rate of the DRAM may be improved or data reliability of the DRAM may be improved. Therefore, the performance of the electronic system may be improved as a whole.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   active regions defined by an isolation layer that is formed in a semiconductor substrate;
   a gate trench formed in a gate region where the active regions and the isolation layer are recessed;
   a buried gate formed in a lower portion of the gate trench; and
   a storage node contact directly contacting to three sidewalls of a first junction region of each active region, which is arranged in a first side of the gate trench,
   wherein a plurality of active regions among the active regions, which share the buried gate, are arranged in parallel rows.

2. The semiconductor device of claim 1, wherein a width of the gate trench formed in the isolation layer is different from that of the gate trench formed in the active regions.

3. The semiconductor device of claim 2, wherein the width of the gate trench formed in the isolation layer is greater than that of the gate trench formed in the active regions.

4. The semiconductor device of claim 2, wherein a first side of the gate trench formed in the isolation layer protrudes more than a first side of the gate trench formed in the active regions.

5. The semiconductor device of claim 2, wherein both sides of the gate trench formed in the isolation layer protrude more than both sides of the gate trench formed in the active regions.

6. The semiconductor device of claim 1, wherein the storage node contact is in contact with an inner sidewall of the gate trench.

7. The semiconductor device of claim 6, wherein a portion of the storage node contact, which is in contact with the inner sidewall of the gate trench, has a thickness that is substantially the same as a gate insulating layer.

8. The semiconductor device of claim 6, wherein a portion of the storage node contact, which is in contact with a sidewall of the gate trench other than the inner sidewall of the gate trench, has a thickness that is substantially the same thickness as a sidewall insulating layer of each active region.

9. The semiconductor device of claim 1, further comprising:
   a bit line contact surrounding both sidewalls of a second junction region of the active region arranged in a second side of the gate trench.

10. The semiconductor device of claim 9, wherein the bit line contact is in contact with an inner sidewall of the gate trench.

11. The semiconductor device of claim 10, wherein a portion of the bit line contact, which is in contact with the inner sidewall of the gate trench, has a thickness that is substantially the same as a gate insulating layer.

12. The semiconductor device of claim 9, further comprising:
   a bit line extending in a direction perpendicular to the buried gate, and coupled to the bit line contact; and
   an air gap located at either side of the bit line.

13. A method of manufacturing a semiconductor device, the method comprising:
   forming an isolation layer in a semiconductor substrate to define active regions arranged in parallel in a row;
   etching the isolation layer and the active regions to form a gate trench;
   forming a buried gate in a lower portion of the gate trench; and
   forming a storage node contact directly contacting to three sidewalls of a first junction region of each active region, which is arranged in a first side of the gate trench.

14. The method of claim 13, wherein the forming of the isolation layer includes:
   etching the semiconductor substrate to form a first isolation trench, which defines first active regions arranged in parallel in a line type;
   forming a first sidewall insulating layer on a sidewall of the first isolation trench;
   forming a first insulating layer on the first sidewall insulating layer to be buried within the first isolation trench to form a first isolation layer;
   etching the first active regions and the first isolation layer in a line type extending to the same direction as the gate to form a second isolation trench;
   forming a second sidewall insulating layer on a sidewall of the second isolation trench; and
   forming a second insulating layer on the second sidewall insulating layer to be buried within the second isolation trench to form a second isolation layer.

15. The method of claim 13, wherein a width of the gate trench formed in the isolation layer is different from that of the gate trench formed in the active regions.

16. The method of claim 15, wherein the etching of the isolation layer and the active regions includes:
   forming the gate trench to have a uniform width in the isolation layer and the active regions; and
   partially widening the gate trench formed in the isolation layer.

17. The method of claim 13, wherein the forming of the storage node contact includes:
   forming a storage node contact hole to expose the first junction region, a sidewall insulating layer formed on a sidewall of the first junction region, and a gate insulating layer formed on a sidewall of the gate trench;
   removing the exposed sidewall insulating layer and the gate insulating layer by a certain depth; and
   forming a conductive layer to be buried within a region where the sidewall insulating layer and the gate insulating layer are removed and the storage node contact hole.

18. The method of claim 13, further comprising, before the forming of the storage node contact, forming a bit line contact surrounding both sidewalls of a second junction region of the active region, which is arranged in a second side of the gate trench.

19. The method of claim 18, wherein the forming of the bit line contact includes:
forming a bit line contact hole to expose the second junction region and a gate insulating layer formed on a sidewall of the gate trench;
removing the exposed gate insulating layer by a certain thickness; and
forming a conductive layer to be buried within the bit line contact hole and a region where the gate insulating layer is removed.

20. A processing system comprising:
a processing unit suitable for performing data processing;
a main memory device suitable for storing data to be processed by the processing unit or data processed by the processing unit;
a storage device coupled to the main memory device and suitable for storing data to be processed in the main memory device or data processed in the main memory device; and
a control device suitable for controlling data or a signal exchanged among the CPU, the main memory device, and the storage device,
wherein the main memory device includes:
active regions defined by an isolation layer that is formed in a semiconductor substrate;
a gate trench formed in a gate region where the active regions and the isolation layer are recessed;
a buried gate formed in a lower portion of the gate trench; and
a storage node contact directly contacting to three sidewalls of a first junction region of each active region, which is arranged in a first side of the gate trench,
wherein a plurality of active regions among the active regions, which share the buried gate, are arranged in parallel rows.

21. An electronic apparatus comprising:
a processor suitable for performing an operation on data;
a dynamic random access memory (DRAM) suitable for storing data processed by the processor;
a connection unit suitable for exchanging a signal between the processor and an external processing system; and
an output unit suitable for outputting the data processed by the processor to an external output apparatus,
wherein the DRAM includes:
active regions defined by an isolation layer that is formed in a semiconductor substrate;
a gate trench formed in a gate region where the active regions and the isolation layer are recessed;
a buried gate formed in a lower portion of the gate trench; and
a storage node contact directly contacting to three sidewalls of a first junction region of each active region, which is arranged in a first side of the gate trench,
wherein a plurality of active regions among the active regions, which share the buried gate, are arranged in parallel rows.

22. A solid state disc comprising:
a nonvolatile memory suitable for storing data and reading the stored data, based on a control signal;
a buffer memory suitable for temporarily storing data input from and outputting to the nonvolatile memory device; and
a memory controller suitable for controlling data input and data output for the nonvolatile memory and the buffer memory, based on a command applied from an external,
wherein the buffer memory includes:
active regions defined by an isolation layer that is formed in a semiconductor substrate;
a gate trench formed in a gate region where the active regions and the isolation layer are recessed;
a buried gate formed in a lower portion of the gate trench; and
a storage node contact directly contacting to three sidewalls of a first junction region of each active region, which is arranged in a first side of the gate trench,
wherein a plurality of active regions among the active regions, which share the buried gate, are arranged in parallel rows.

23. An electronic apparatus, comprising:
a processor suitable for performing an operation on data or controlling an operation of a system;
a dynamic random access memory (DRAM) suitable for storing data to be processed by the processor or data processed by the processor; and
an interface device suitable for exchanging a control signal or data with an external,
wherein the DRAM includes:
active regions defined by an isolation layer that is formed in a semiconductor substrate;
a gate trench formed in a gate region where the active regions and the isolation layer are recessed;
a buried gate formed in a lower portion of the gate trench; and
a storage node contact directly contacting to three sidewalls of a first junction region of each active region, which is arranged in a first side of the gate trench,
wherein a plurality of active regions among the active regions, which share the buried gate, are arranged in parallel rows.

* * * * *